US008686587B2

(12) United States Patent
Samuel (10) Patent No.: US 8,686,587 B2
(45) Date of Patent: Apr. 1, 2014

(54) POWER GENERATOR FOR BOOSTER AMPLIFIER SYSTEMS

(75) Inventor: Robello Samuel, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 260 days.

(21) Appl. No.: 13/290,484

(22) Filed: Nov. 7, 2011

(65) Prior Publication Data

US 2012/0228876 A1    Sep. 13, 2012

Related U.S. Application Data

(60) Provisional application No. 61/451,505, filed on Mar. 10, 2011.

(51) Int. Cl.
    *F03D 9/00* (2006.01)
(52) U.S. Cl.
    USPC .......................................................... 290/55
(58) Field of Classification Search
    USPC .............................................. 290/55, 44–45
    See application file for complete search history.

(56) References Cited

U.S. PATENT DOCUMENTS

| | | | |
|---|---|---|---|
| 5,405,250 A * | 4/1995 | Vowles et al. | 417/331 |
| 7,816,797 B2 | 10/2010 | Nair | |
| 7,816,799 B2 * | 10/2010 | Nair et al. | 290/44 |
| 7,816,833 B2 | 10/2010 | Nair | |
| 8,604,632 B2 * | 12/2013 | Hardin et al. | 290/43 |
| 2004/0016571 A1 * | 1/2004 | Krueger | 175/61 |
| 2010/0253089 A1 * | 10/2010 | Huang et al. | 290/1 R |
| 2010/0308670 A1 | 12/2010 | Nair et al. | |
| 2011/0089697 A1 * | 4/2011 | Nair | 290/53 |
| 2012/0228882 A1 * | 9/2012 | Dirksen | 290/1 R |

OTHER PUBLICATIONS

Rath, Sumit et al., "Amplifier/Booster Joint Positioning Framework Design for a High-Speed Wired Telemetry System in MWD/LWD Downhole Tool Environment," SPE 134504, Sep. 19-22, 2010.

* cited by examiner

*Primary Examiner* — Truc Nguyen
(74) *Attorney, Agent, or Firm* — Benjamin Fite; Baker Botts L.L.P.

(57) ABSTRACT

A system to harvest energy from fluid flow includes: an outer body including a flowway; an inner sleeve rotatably coupled to the outer body; and a magnetostrictive material disposed proximate to the inner sleeve to be strained due to a rotation of the inner sleeve in response to a fluid flow in the flowway.

20 Claims, 7 Drawing Sheets

POWER GENERATOR FOR BOOSTER AMPLIFIER SYSTEMS

CROSS-REFERENCE TO RELATED APPLICATION

This application claims the benefit of U.S. Provisional Application No. 61/451,505, which was filed Mar. 10, 2011, and is hereby incorporated by reference in its entirety.

BACKGROUND

The present disclosure relates to power generators for booster amplifier systems and, more particularly, to providing electrical power to boost amplifier systems for downhole tools utilizing magnetostrictive materials.

Data transmission from downhole tools to the surface may be extremely important to drilling engineers for real-time decision making and well economics. With new advances and innovations in downhole technologies, particularly in the areas of drilling optimization and MWD/LWD (measurement while drilling/logging while drilling) technologies, the current data transmission rates may be insufficient for the complete use of all downhole data that can be acquired. Digitization of transmission systems can increase the overall efficiency and accuracy of data acquisition systems. The benefits include increased reliability and large volumes of data on which to base current and future decisions. With its innovative technology, a high-speed wired telemetry drill pipe system can achieve this. A network, consisting of embedded wires along the drill string, can achieve higher transmission rates from downhole tools to the surface in real time; it can enable the complete use of technological advances in approximately the same amount of rig time as is required with mud pulse or electromagnetic telemetry systems. However, signal loss may occur in certain applications.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

The present disclosure relates to power generators for booster amplifier systems and, more particularly, to providing electrical power to boost amplifier systems for downhole tools utilizing magnetostrictive materials.

Illustrative embodiments of the present invention are described in detail herein. In the interest of clarity, not all features of an actual implementation may be described in this specification. It will of course be appreciated that in the development of any such actual embodiment, numerous implementation-specific decisions must be made to achieve the specific implementation goals, which will vary from one implementation to another. Moreover, it will be appreciated that such a development effort might be complex and time-consuming, but would nevertheless be a routine undertaking for those of ordinary skill in the art having the benefit of the present disclosure.

In certain embodiments according to the present disclosure, magnetostrictive technology may be capable of generating electrical power during the process of drilling a borehole by using the mechanical energy generated in a downhole drilling assembly. Magnetostrictive materials have the ability to convert kinetic/elastic energy into magnetic energy that may be used to generate electrical power. Magnetostrictive materials have the property that, when strain is induced in the material, the change in linear dimensions produces a corresponding change in magnetic field about the material. In other words, mechanical loads can deform the material and thereby rotate magnetic domains. The change of the magnetic flux can be used to generate electrical power. A suitable material for the magnetostrictive material may be Terfenol-D, available from Etrema Products, Inc. Various materials, e.g., iron and iron alloys such as Terfenol, may provide suitable magnetostrictive and giant magnetostrictive responses. These materials normally respond to a force applied to their mechanical connection by creating a magnetic field which can be detected, for example, by a surrounding coil.

In certain embodiments of the present disclosure, a high-speed wired telemetry system may be installed within a drill string. In certain embodiments, this system may use no moving parts. In certain embodiments, the drill string may operate at a high bit rate, e.g., approximately 57,000 bits per second. Such a high bit rate may be advantageous as it may enable more information to be gathered in the same amount of rig time than is possible with the mud, electromagnetic, or acoustic telemetry methods. The quality of the information obtained may be very high. The logging information obtained may enable an analysis of the formation, and the high resolution images (e.g., 8 to 16 gamma ray pictures) may be useful to geologists and geophysicists. In certain embodiments, these methods may also enable better statistical analyses to be performed. In certain embodiments, many multisensors may be placed to retrieve the information downhole. These sensors can play an effective role in data transmission and provide a foundation of independent data transmission architecture.

Figure 1:
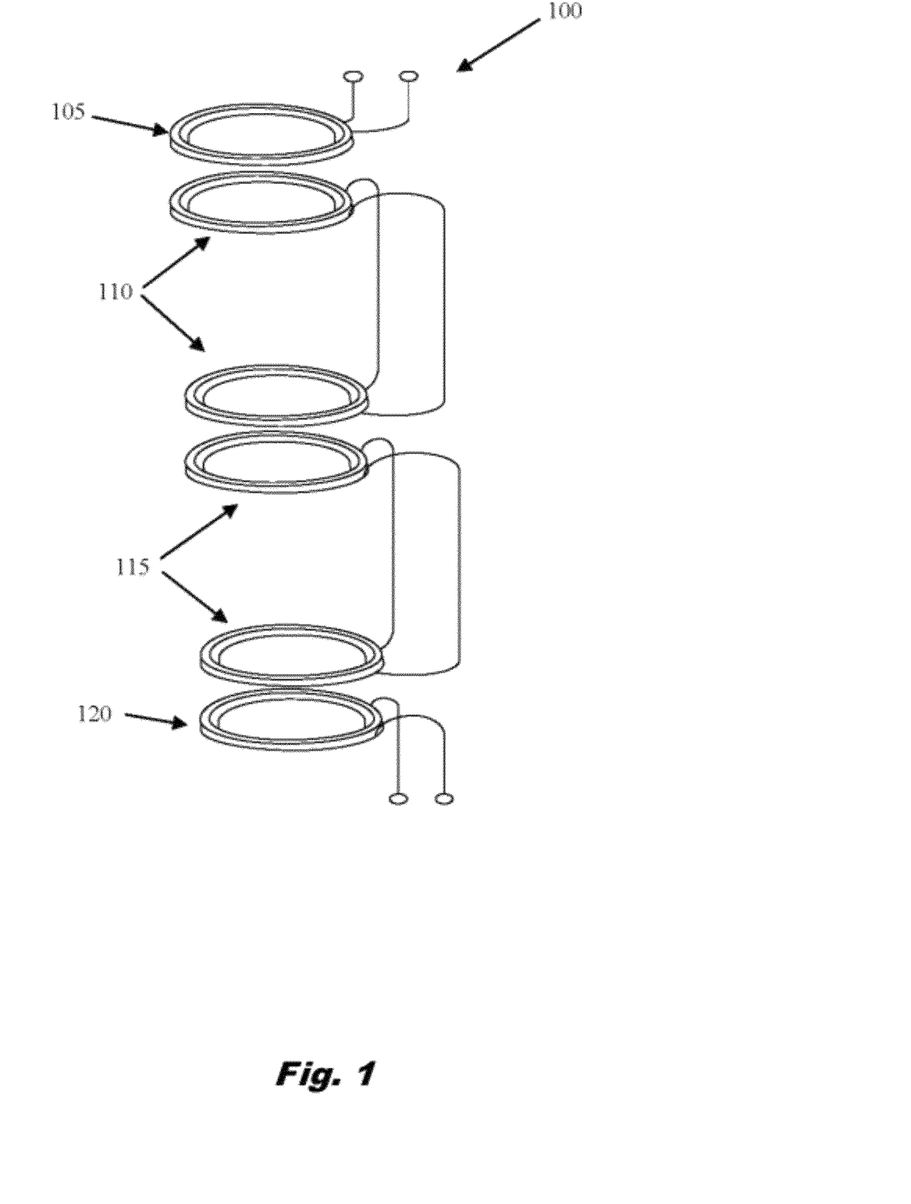
FIG. 1 illustrates a coil system of a high-speed wired telemetry system that may be installed within a drill string, in accordance with certain embodiments of the present disclosure.

FIG. 1 illustrates a coil system 100 of a high-speed wired telemetry system that may be installed within a drill string. In the example depicted, a coil 105 may be installed with one drill string section; coil pairs 110, 115 each may be installed with adjoining drill string sections; and the coil 120 may be installed with a lower drill string section. As such, the coils of a coil pair may be directly wired to relay signals across one or more drill string sections. And adjacent coils may transfer signals across drill string section junctions. A coil on a sending side may energize the coil on a receiving side, which enables the communication between two drill string components. Such wired telemetry drill pipes may have data transmission rates of approximately 57,000 bits/second or even up to approximately 2 megabits/second. This method may work well for underbalanced drilling where mud pulse telemetry may become unusable.

In some applications, the signal may undergo attenuation and experience material losses along the way. The signal losses may be calculated along each drill string segment, and the algorithm may maintain a continuous measurement of the effective signal strength at the end of each segment. A power source or amplifier may be placed at depths where there will be an effective loss of signal. And, to prevent the loss of signals, amplifier/booster subs may be placed along the string so that data signal transmission from downhole to the surface systems is enabled. An accurately placed amplifier/booster system may be an essential part for the success of the wired telemetry system. It can address signal losses and can ensure that the integrity of essential signal parameters (such as bandwidth, bit accuracy, signal strength) remains consistent throughout the transmission path.

Figure 2A:
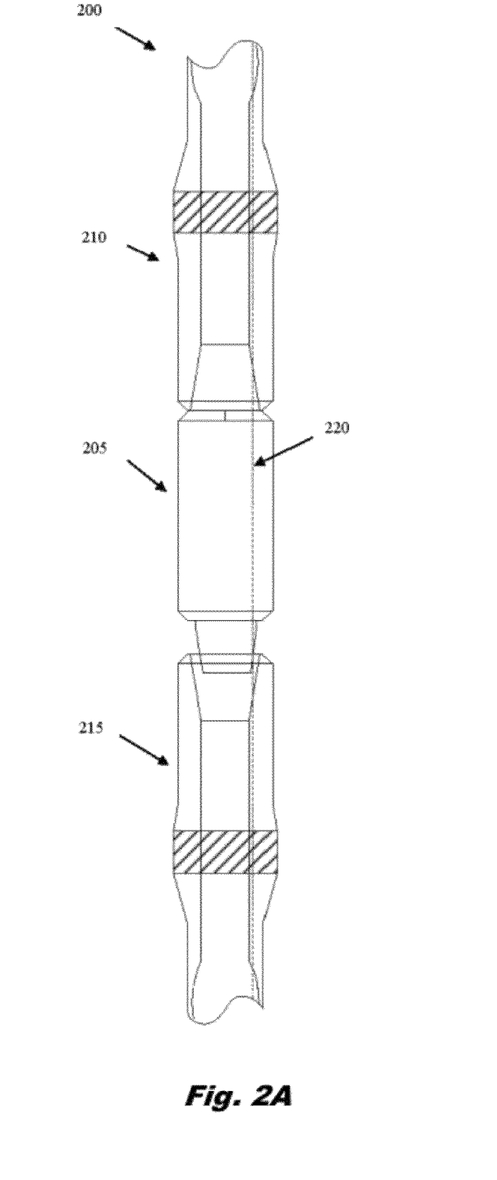
FIGS. 2A and 2B show exemplary drill strings with amplifier booster subs, in accordance with certain embodiments of the present disclosure.

FIG. 2A shows one exemplary drill string 200 with an amplifier booster sub 205, in accordance with certain embodiments of the present disclosure. The drill string 200 depicted may be part of a larger drill string assembly that, for example, may be suspended in a wellbore by a derrick (not shown). The drill string 200 may include a series of coupled sections. As depicted, the amplifier booster sub 205 may be an intermediate section coupled to an upper section 210 and a lower section 215. In certain embodiments, an armored coaxial cable 220 may run through at least a portion of the drill string 200.

Figure 2B:
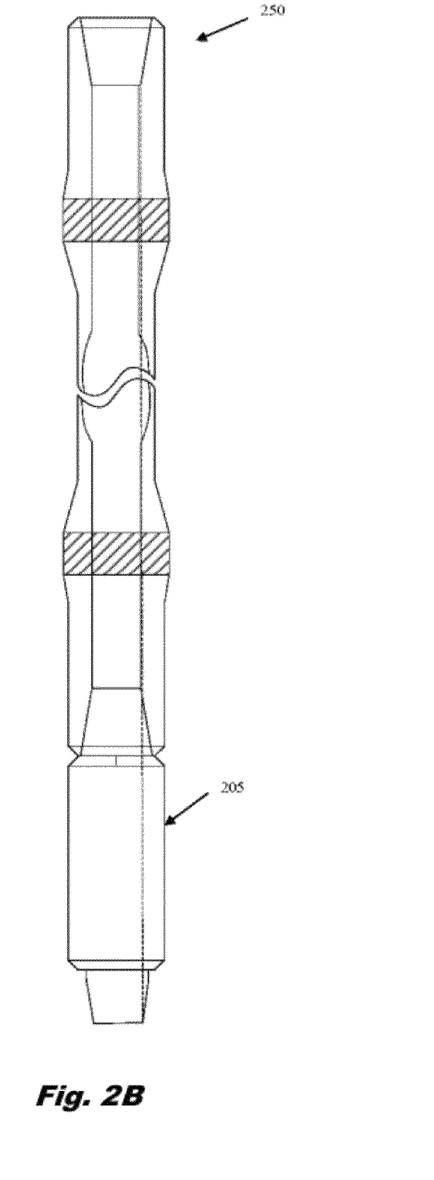

The amplifier booster sub 205 may have any suitable position with a drill string. FIG. 2B shows another exemplary drill string 250 with an amplifier booster sub 205, in accordance with certain embodiments of the present disclosure. As depicted, the amplifier booster sub 205 may be at a lower position in the drill string 250, rather than being in an intermediate position as shown in FIG. 2A.

In certain embodiments, an algorithm may define the boundary condition(s) where an amplifier booster may best be placed. The algorithm may indicate an optimal placement where the signal strength reaches the pre-defined boundary condition(s). In certain embodiments, the booster joint/amplifier system may include transceivers capable of receiving an incoming data signal and re-strengthening the received signal to its pre-defined strength; it is then transmitted to the next segment. In certain embodiments, the booster joint/amplifier system may be a complex structure that incorporates bit-encoding/decoding techniques to ensure the accuracy of the signal and the continuity of the transmission. Losses during the bidirectional signal transmission may be calculated. These losses may include Ohmic, attenuation, hysteresis, eddy, and induction losses.

Figure 3:
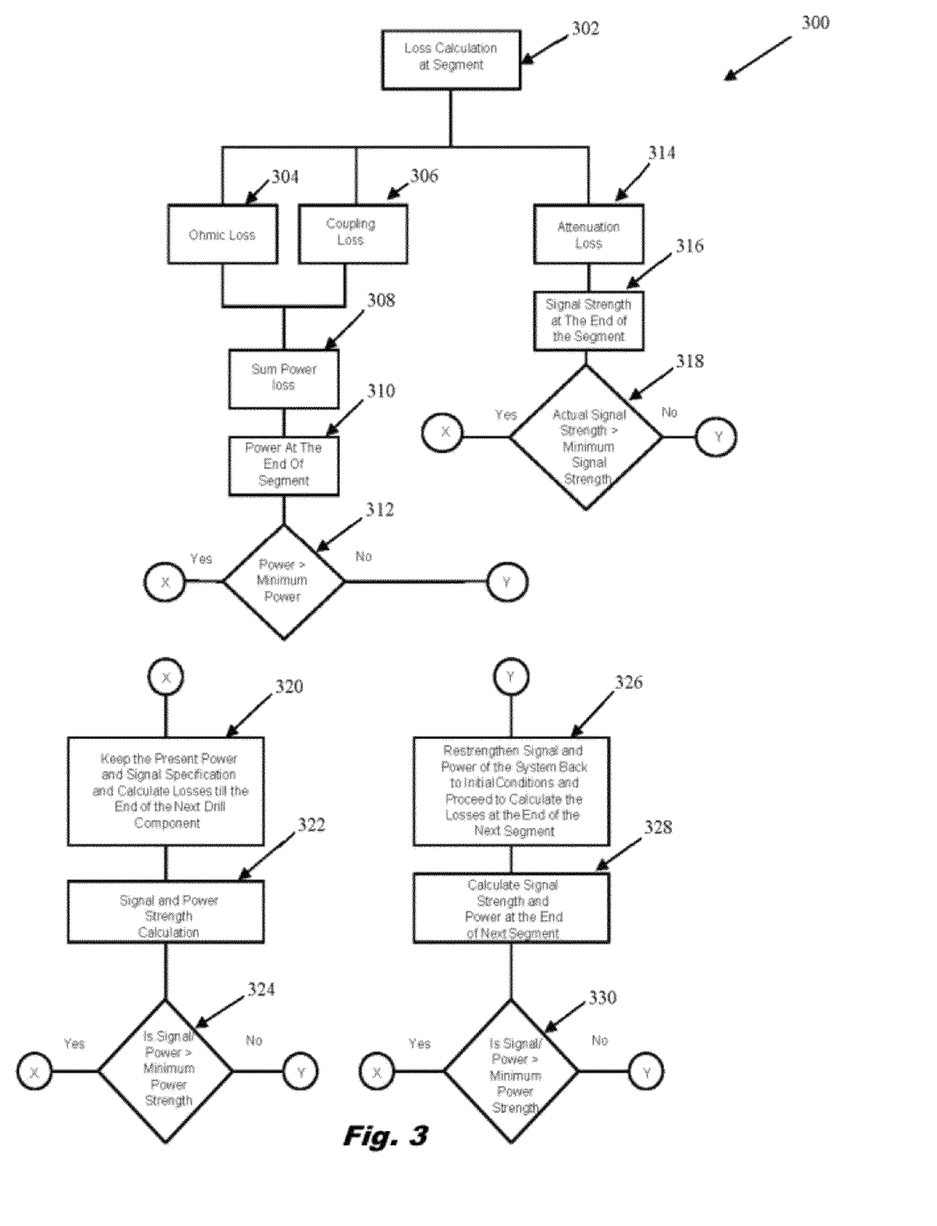
FIG. 3 depicts a flow diagram for an example method, in accordance with certain embodiments of the present disclosure.

One focus of a method of the present disclosure is on ensuring that the transmitting signal would have an acceptable power range at all times, which may be approximately 90% of the maximum power possible, for example. FIG. 3 depicts a flow diagram for an example method 300, in accordance with certain embodiments of the present disclosure. Teachings of the present disclosure may be utilized in a variety of implementations. As such, the order of the steps comprising the method 300 may depend on the implementation chosen.

According certain embodiments, the method 300 may begin at step 302 with the selection of a particular segment of the drill string. At steps 304 and 306, Ohmic and coupling losses may be calculated across the segment, and the induction (hysteresis and eddy) losses may be calculated at each tool joint junction. At steps 308 and 310, the power losses and the power at the end of the segment may be determined. The total power at the junction may be deduced, and, at step 312, it may be determined whether or not the signal remained at an acceptable level. Likewise, at steps 314 and 316, attenuation losses may be calculated across the segment, and the signal strength at the end of the segment may be determined. At step 318, it may be determined whether the actual signal strength is greater than a minimum signal strength. If the power and/or the actual signal strength are above the minimum thresholds, then the current power and signal specification may be maintained and losses may be calculated till the end of the next drill component, as indicated by step 320. As indicated by steps 322 and 324, the signal and power strength calculations and checks may continue, looping back to step 320 while threshold conditions are met.

As indicated at step 326, if the power and/or actual signal strength fail to meet a threshold, the signal and/or the power of the system may be strengthened back to initial conditions and the losses at the end of the next segment may be calculated. As indicated by steps 328 and 330, the calculations and checks of the signal and power strength at the end of the next segment may continue, looping back to step 326 until threshold conditions are met.

Thus, with boundary conditions defined at corresponding tool joints, booster/amplifiers may be positioned to re-strengthen the signal and retransmit it further toward the surface. The process may be continued throughout the drill string length until the transmitted signal from the MWD tool suite reaches the surface receivers with suitable power and signal strength. The surface receivers then may transmit the signal using wireless radio frequency system to data processing units, which may then harvest the incoming signal and convert it into logs or other pertinent information.

Figure 4A:
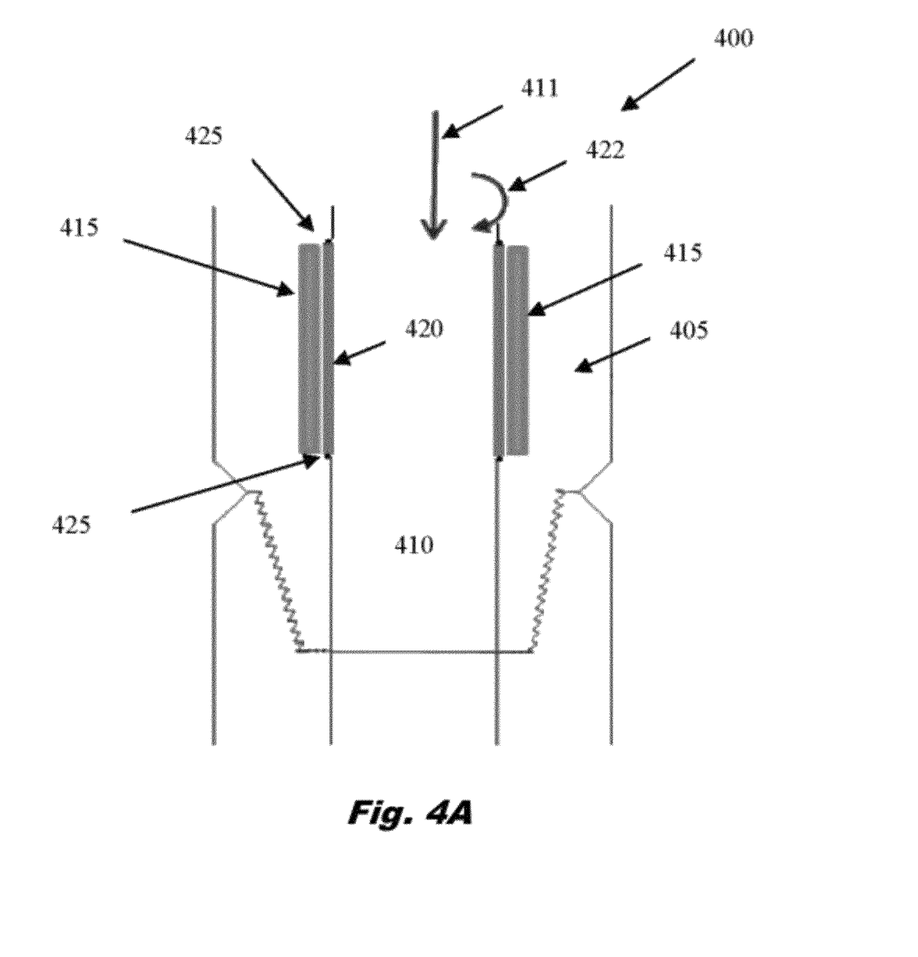
FIG. 4A is a partial cross-sectional illustration of an example power generator, in accordance with certain embodiments of the present disclosure.

FIG. 4A is a partial cross-sectional illustration of an example power generator 400, in accordance with certain embodiments of the present disclosure. The power generator 400 may include an outer body 405 with a bore 410 running therethrough. The outer body 405 may be a sub, any suitable section of a drill string, or more generally a tubular about a flowway. The power generator 400 may further include one or more magnetostrictive elements 415. The magnetostrictive element 415 may include magnetostrictive material and may be disposed in the power generator 400 in any suitable manner. By way of non-limiting example, the magnetostrictive element 415 may be embedded, attached to, affixed to, or otherwise coupled to the outer body 405. In certain embodiments of a booster/amplifier sub, the magnetostrictive element 415 may be embedded along the side of the body of the booster sub. The magnetostrictive element 415 may take any suitable form. By way of non-limiting example, the forms of the magnetostrictive element 415 about the bore 405 may include a cylinder, a non-continuous cylindrical form, a series of adjacent members, etc. An inner shaft or sleeve 420 may be disposed along the bore 410 of the outer body 405. In various embodiments, the magnetostrictive element 415 may encircle at least a portion of the sleeve 120, partially surround the sleeve 120, or otherwise be disposed about the sleeve 120.

Figure 4B:
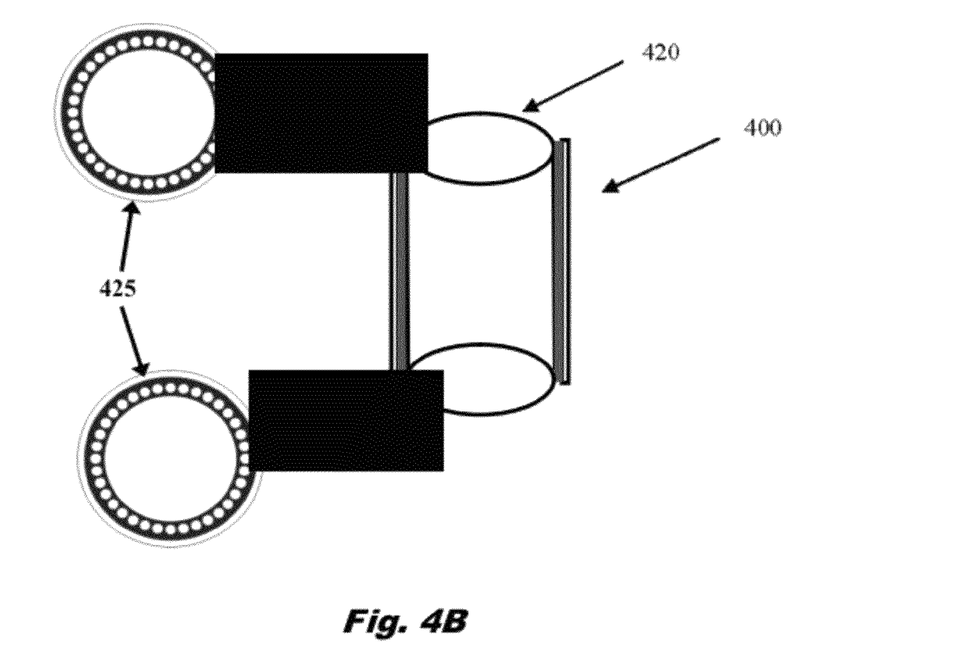
FIGS. 4B and 4C are simplified partial illustrations of the example power generator of FIG. 4A, in accordance with certain embodiments of the present disclosure.

The sleeve 420 may be rotatably mounted to the outer body 405 by way of the bearing mounts 425. In certain embodiments, the mounts 425 may be ball bearing mounts, roller bearing mounts, or any suitable mount facilitating or allowing rotation of the sleeve 420. FIG. 4B is a simplified partial illustration of the power generator 400 showing top and bottom bearing mounts 425 for the sleeve 425, in accordance with certain embodiments of the present disclosure.

Figure 4C:
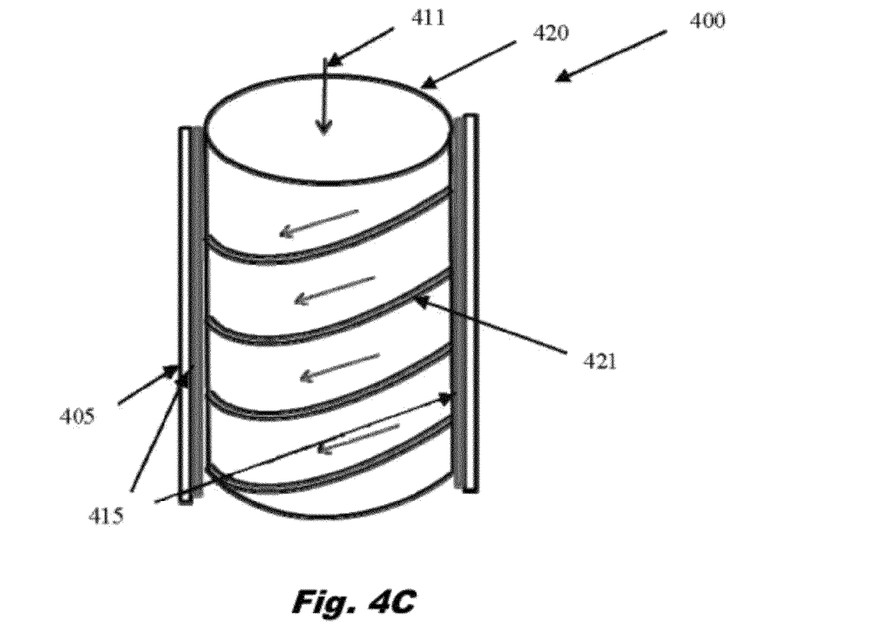

FIG. 4C is another simplified partial illustration of the power generator 400, in accordance with certain embodiments of the present disclosure. The sleeve 420 may include one or more helical formations 421, which may for example be one or more of ribs, ridges or vanes, formed to engage and deflect at least a portion of the axial flow 411 of fluid through the bore 410 so that the sleeve 420 rotates. It should be understood that the sleeve 420, helical formations 421, and rotation 422 depicted are merely exemplary; any suitable sleeve, helical formation, pitch, and direction of rotation may implemented within the spirit of this disclosure. In certain embodiments, the helical path may be variable so that the pressures on the magnetostrictive element 415 can be modulated.

The sleeve 420 may have a tight fit with the magnetostrictive element 415. In certain embodiments, the magnetostrictive element 415 may be in contact with the fluid. For example, the helical formation 421 may be formed on the exterior of the sleeve 415, allowing fluid flow between the ridges. With suitable fluid flow 411 and rotation 422 of the sleeve 420 in the stationary outer body 405, the frictional force and the hydraulic force based on the motion may be used to strain the magnetostrictive element 415. In certain embodiments, the sleeve 420 may be a rotating impeller type shaft that may rotate as the mud passes through the pipe. This may cause stress to be applied to the side of the magnetostrictive materials embedded on the side of the housing.

The pressure applied to the polarized crystals may produce a mechanical deformation which in turn results in an electrical charge. In other words, the magnetostrictive material in the magnetostrictive element 415 may use the strain energy to generate an electrical charge distribution producing a magnetic field which may be converted to electrical energy. Accordingly, the rotation of the sleeve 410 may be converted into mechanical stress and further may be converted into electrical charge through the use of magnetostrictive material 415 embedded inside the housing. One or more conductors may be disposed proximate to the material 415 and coupled to the material 415 to allow current to be induced, which includes being coupled in direct contact or coupled magnetically or inductively, for example. A conductor loop may be disposed in any suitable position in the magnetic circuit. For example, one or more wire coils may wound around, positioned above, positioned below, or positioned on the side of the magnetostrictive material 415.

Figure 5:
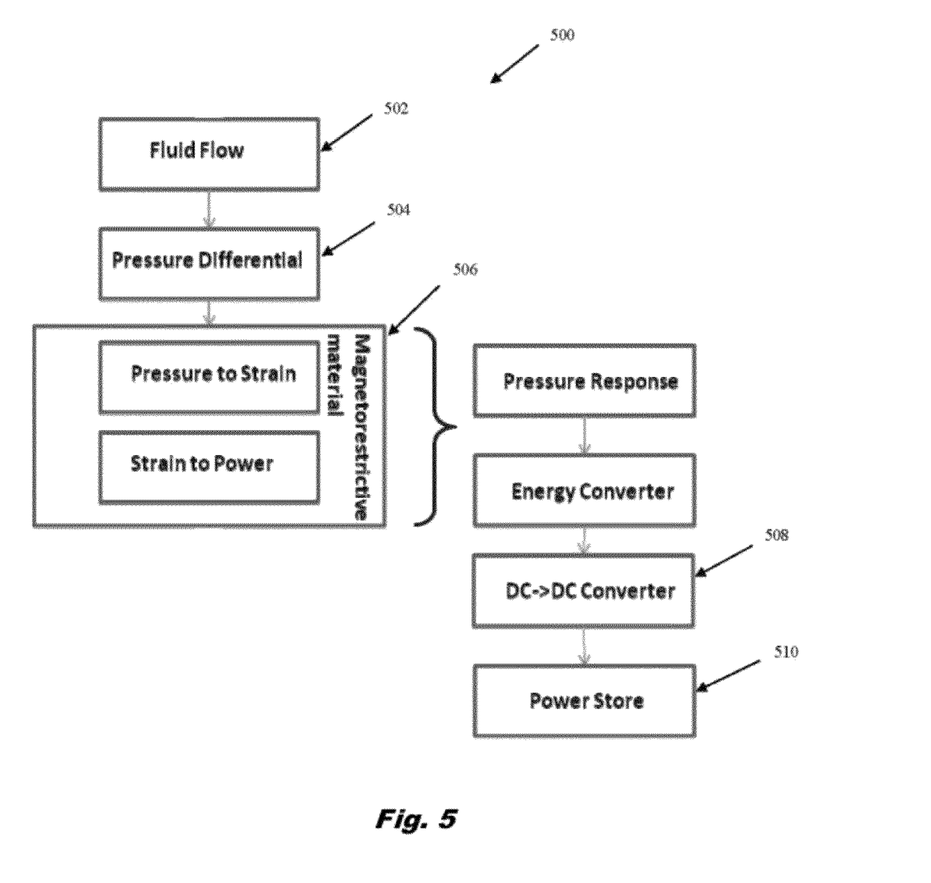
FIG. 5 depicts a flow diagram for an example method of generating power, in accordance with certain embodiments of the present disclosure.

FIG. 5 depicts a flow diagram for an example method 500 of generating power, in accordance with certain embodiments of the present disclosure. The method 500 may begin at step 502 with fluid flow through the power generator. In certain embodiments, the fluid may be drilling mud. At step 504, a pressure differential is created due at least in part to the helical formations and consequent rotation of the power generator. At step 506, the pressure results in strains of the magnetostrictive material, and the strain shifts the magnetic domain of the material, creating electrical charge to provide an electrical power output. As such, the magnetostrictive is a transition element between the mechanical and electrical domains. Thus, in response the pressure, strain energy is converted to electrical energy. In certain embodiments, at step 508, the electrical charge may be rectified and regulated to provide a reliable power supply. And in certain embodiments, at step 510, the power may be stored, e.g., in a battery.

Figure 6:
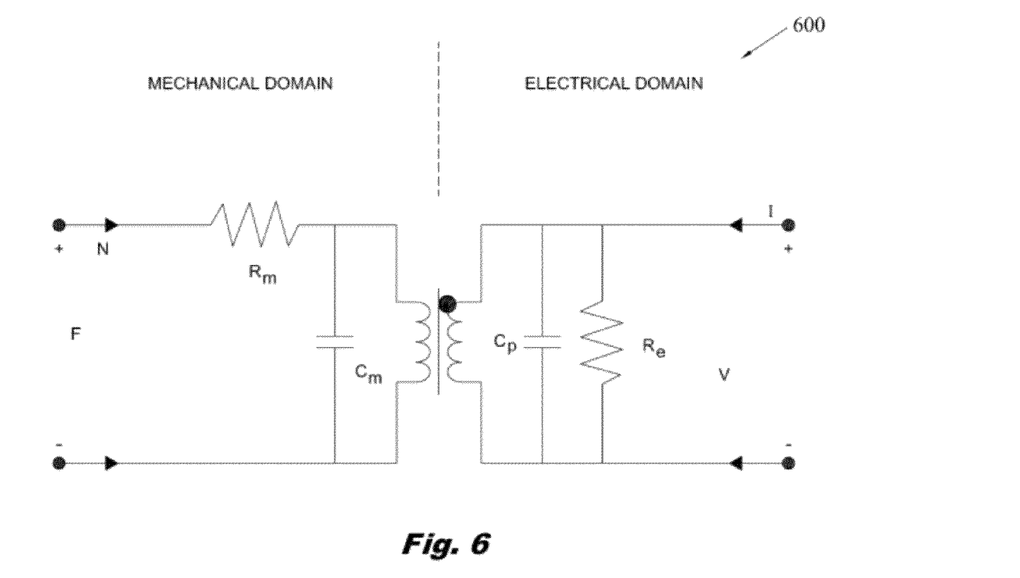
FIG. 6 is a diagram of an example of an equivalent circuit between the mechanical and the electrical domains, in accordance with certain embodiments of the present disclosure.

FIG. 6 shows an example of an equivalent circuit 600 between the mechanical and the electrical domains, in accordance with certain embodiments of the present disclosure. In the illustrated embodiment, the input force F and voltage V across the magnetostrictive material may be the generalized effort variables, whereas the speed N and current I may be the generalized flow variables. In the mechanical domain, Rm may be the mechanical damping; Cm may be the compliance of the housing. In the electrical domain, Cp may be the capacitance; Rc may be dielectric loss. The transfer of energy from the magnetostrictive material to a storage element (not shown) such as a battery may be facilitated in any suitable manner.

Accordingly, in certain embodiments implemented in a booster/amplifier/repeater sub, as fluid flows through the sub, the fluid energy may be used to convert magnetic and/or electric energy which is further used to power the booster/amplifier/repeater sub. Energy may be reclaimed from the strain energy induced by the rotation of a shaft placed inside the sub. The energy may be converted to useful electrical energy based on magnetostrictive principles.

Figure 7:
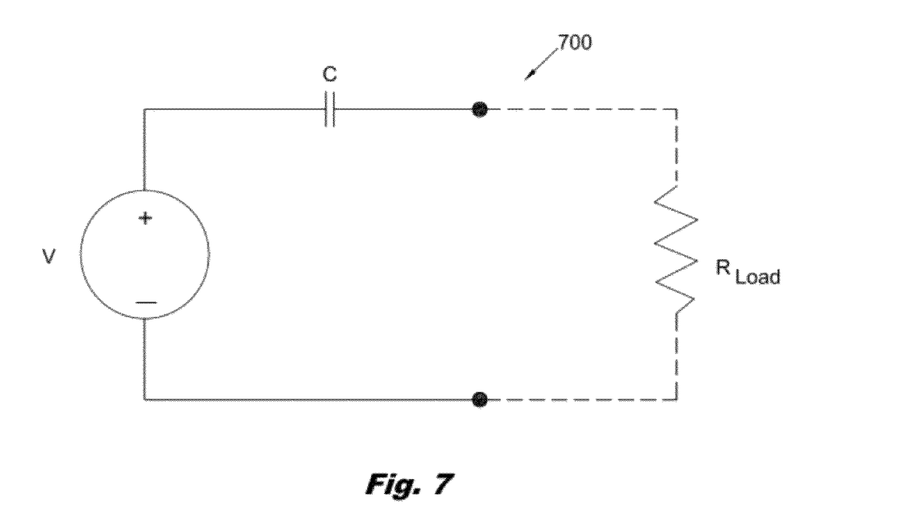
FIG. 7 depicts an example magnetostrictive voltage output diagram, in accordance with certain embodiments of the present disclosure.

FIG. 7 depicts an example magnetostrictive voltage output diagram 700, in accordance with certain embodiments of the present disclosure. In certain embodiments, an applied force will produce a voltage that may be expressed by:

$$V = Q_f/C$$

where $Q_f$ is the charge resulting from the force and C is the capacitance of the device. In certain embodiments, the charge sensitivity or the magnetostrictive constant d defined as the charge generated per unit force applied may be given by:

$$d = \frac{Q}{f}$$

where Q is charge developed.

The voltage sensitivity may be defined as the field produced per unit stress applied and may be given by the following equation:

$$g = \frac{\frac{V}{t}}{\sigma} = \frac{\frac{V}{t}}{\frac{f}{wl}} \text{ therefore } g = \frac{Vwl}{f \times t}$$

but capacitance $$C = k\varepsilon \frac{\text{area}}{\text{distance}}$$

so $$g = \frac{V}{\varepsilon f} \frac{C}{k} = \frac{Q}{k \times \varepsilon f} = \frac{d}{k \times \varepsilon}$$

where:
t=thickness of the transducer;
l=length;

w=width;
∈=dielectric constant;
C=capacitance formed in the transducer; and
Q=charge developed.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A system to harvest energy from fluid flow, the system comprising:
    an outer body comprising a flowway;
    an inner sleeve rotatably coupled to the outer body; and
    a magnetostrictive material disposed proximate to the inner sleeve to be strained due to a rotation of the inner sleeve in response to a fluid flow in the flowway.

2. The system to harvest energy from fluid flow of claim 1, further comprising a conductor disposed proximate to the magnetostrictive material, wherein an electrical current is produced in the conductor due to a strain in the magnetostrictive material.

3. The system to harvest energy from fluid flow of claim 2, wherein the conductor comprises a coil disposed about an exterior surface of the magnetostrictive material.

4. The system to harvest energy from fluid flow of claim 1, wherein the inner sleeve comprises a helical formation extending from a surface of the inner sleeve so that at least a portion of the fluid flow impinges upon the helical formation.

5. The system to harvest energy from fluid flow of claim 1, wherein the system is implemented with a booster sub.

6. The system to harvest energy from fluid flow of claim 1, wherein the magnetostrictive material encircles the inner sleeve.

7. The system to harvest energy from fluid flow of claim 1, wherein the magnetostrictive material partially surrounds the inner sleeve.

8. A drill string apparatus comprising:
    an outer body;
    a magnetostrictive material along a side of the outer body;
    a shaft at least partially housed in the outer body and comprising a helical formation, the shaft to rotate inside the outer body in conjunction with fluid flow through the outer body, and the magnetostrictive material to be strained in conjunction with a rotation of the shaft.

9. The drill string apparatus of claim 8, further comprising a conductor disposed proximate to the magnetostrictive material, wherein an electrical current is produced in the conductor due to a strain in the magnetostrictive material.

10. The drill string apparatus of claim 9, wherein the conductor comprises a coil disposed about an exterior surface of the magnetostrictive material.

11. The drill string apparatus of claim 8, wherein the helical formation extends from an inner surface of the shaft so that at least a portion of the fluid flow impinges upon the helical formation.

12. The drill string apparatus of claim 8, wherein the helical formation extends from an outer surface of the shaft so that at least a portion of the fluid flow impinges upon the helical formation.

13. The drill string apparatus of claim 8, further comprising:
    an amplifier booster sub; and
    a conductor disposed proximate to the magnetostrictive material, wherein an electrical current is produced in the conductor due to a strain in the magnetostrictive material;
    wherein the electrical current supplies power to the amplifier booster sub.

14. The drill string apparatus of claim 8, wherein the magnetostrictive material encircles the shaft.

15. The drill string apparatus of claim 8, wherein the magnetostrictive material partially surrounds the shaft.

16. A method of harvesting energy from fluid flow, the method comprising:
    providing an outer body comprising a flowway;
    providing an inner sleeve rotatably coupled to the outer body;
    providing a magnetostrictive material disposed proximate to the inner sleeve to be strained due to a rotation of the inner sleeve in response to a fluid flow in the flowway;
    providing a conductor disposed proximate to the magnetostrictive material; and
    rotating the inner sleeve, wherein the rotation strains the magnetostrictive material, generating an electrical current in the conductor.

17. The method of harvesting energy from fluid flow of claim 16, further comprising: powering an amplifier booster sub with the electrical current.

18. The method of harvesting energy from fluid flow of claim 17, wherein the inner sleeve comprises a helical formation extending from a surface of the inner sleeve, and wherein the step of rotating the inner sleeve comprises:
    providing the fluid flow in the flowway so that at least a portion of the fluid flow impinges upon the helical formation.

19. The method of harvesting energy from fluid flow of claim 16, wherein the magnetostrictive material encircles the inner sleeve.

20. The method of harvesting energy from fluid flow of claim 16, wherein the magnetostrictive material partially surrounds the inner sleeve.

* * * * *